United States Patent [19]

Mudge et al.

[11] Patent Number: 5,473,202
[45] Date of Patent: Dec. 5, 1995

[54] CONTROL UNIT FOR OCCUPANCY SENSOR SWITCHING OF HIGH EFFICIENCY LIGHTING

[75] Inventors: Philip H. Mudge, Brookfield; Brian Platner, 100 Trailwood Dr., Guilford, Conn. 06437

[73] Assignee: Brian Platner, Guilford, Conn.

[21] Appl. No.: 894,091

[22] Filed: Jun. 5, 1992

[51] Int. Cl.⁶ .................................................. H01H 35/00
[52] U.S. Cl. ........................ 307/116; 307/117; 361/173; 361/2
[58] Field of Search .................................. 307/116, 117; 340/500; 361/173, 176, 177, 2–13; 323/235, 236, 319

[56] References Cited

U.S. PATENT DOCUMENTS

| | | | |
|---|---|---|---|
| 3,671,849 | 6/1972 | Kingston | 323/235 |
| 4,356,525 | 10/1982 | Kornrumpf et al. | 361/13 |
| 4,389,691 | 6/1983 | Hancock | 361/8 |
| 4,525,762 | 6/1985 | Norris | 361/13 |
| 4,598,330 | 7/1986 | Woodworth | 361/8 |
| 4,618,906 | 10/1986 | Paice et al. | 371/8 |
| 4,701,676 | 10/1987 | Gibson | 315/362 |
| 4,704,652 | 11/1987 | Billings | 361/3 |
| 4,716,511 | 12/1987 | Masaki | 361/49 |
| 4,745,511 | 5/1988 | Kugelman et al. | 361/8 |
| 4,760,483 | 7/1988 | Kugelman et al. | 361/13 |
| 5,053,907 | 10/1991 | Nishi et al. | 361/9 |

FOREIGN PATENT DOCUMENTS

WO/8601334  2/1986  United Kingdom .

Primary Examiner—William M. Shoop, Jr.
Assistant Examiner—Peter Ganjoo
Attorney, Agent, or Firm—DeLio & Peterson

[57] ABSTRACT

A control unit for switching AC powered high efficiency lighting in response to a signal from an occupancy sensor. The lighting is switched by a hybrid mechanical relay/semiconductor switch. The semiconductor switch is connected in parallel with the relay switch contacts to protect them and is controlled by a noise-insensitive zero voltage crossing detector circuit which switches the semiconductor switch only at the zero crossings of the AC power. The semiconductor switch is preferably turned on by a pulse forming circuit only for a brief period of time spanning the time when the relay is switching.

17 Claims, 2 Drawing Sheets

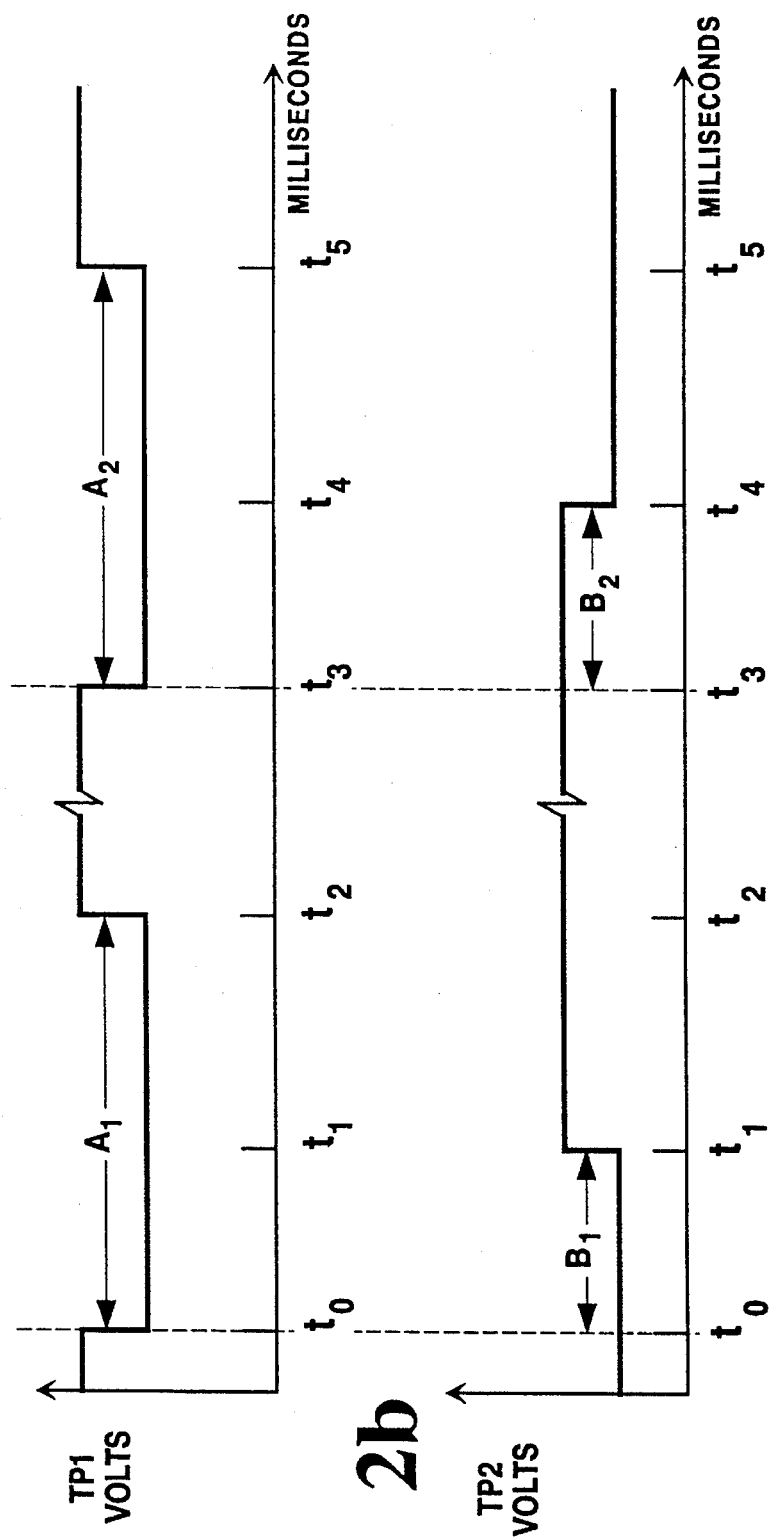

CONTROL UNIT FOR OCCUPANCY SENSOR SWITCHING OF HIGH EFFICIENCY LIGHTING

BACKGROUND OF THE INVENTION

1. Field of the Invention

This invention relates to control units used to automatically turn on room lights, ventilating fans, or heating/cooling equipment whenever the room is occupied. More particularly, the invention relates to control units responsive to occupancy sensors which are capable of switching modern high efficiency fluorescent lights and similar loads.

2. Description of Related Art

Occupancy sensing switch control units are used to reduce energy costs by automatically turning on room lights or environmental control equipment when the room is entered, and turning off the equipment when the room is unoccupied.

Previous control units have used a mechanical relay to carry the AC current load of the lighting. The relay is controlled by an occupancy sensor and associated circuitry to drive the relay actuator. The sensor provides a control signal which operates the relay and turns the lights on whenever the room is occupied.

The occupancy sensor has most commonly been an infrared or ultrasonic detector. The associated circuitry has included a timer which is set each time the control signal indicates that the room is occupied. While the timer is set, and during its timer period, the lights are on. When the timer period ends, the lights are turned off. Small movements by anyone in the room continuously resets the timer to keep the lights on. In the absence of the continual resets, when the room is unoccupied, the timer reaches the end of its timer period and automatically shuts off the lights or other equipment.

This design has worked well to switch standard incandescent and fluorescent lighting. However, such standard lighting fixtures are less efficient than modern high efficiency lights which use electronic ballasting. Electronic ballast places a much different load upon the control unit than standard lights.

It has been found that prior art control units fail prematurely when they are used with electronically ballasted high efficiency fluorescent lights. Although electronically ballasted lights are presently used in only a small percentage of lighting installations, they are likely to be specified for use whenever energy efficiency is a particular concern. Thus, there is a clear need for an occupancy sensor based lighting control unit which can be used in combination with high efficiency lighting.

One difficulty with AC powered high efficiency fluorescent lighting is that it presents a very noisy load for the control unit to switch. Such lights also have a high initial inrush current which must be handled by the control unit switching system. The noise generated when turning on and turning off of the lights has a deleterious effect on the control unit circuitry, and the inrush current can damage the contacts of a mechanical relay which would otherwise easily be capable of handling the steady state load current of the light.

Accordingly, one object of the present invention is to provide an occupancy sensor based control unit which has a long life when used with AC powered high efficiency lighting.

Another object of the present invention is to provide an occupancy sensor based control unit which operates reliably to switch a noisy electrical load and operates reliably in a noisy electrical environment.

Yet another object of the present invention is to provide a control unit switch which can handle high initial inrush currents.

SUMMARY OF THE INVENTION

The present invention comprises a control unit adapted for switching AC powered high efficiency lighting in response to a signal from an occupancy sensor. An on/off control circuit receives a signal from the occupancy sensor and provides an on/off control signal to turn on the lighting load when occupancy is sensed and turn the load off thereafter. A delay means delays the on/off control signal for a delay time before the signal is sent to control a relay.

The relay includes relay switch contacts adapted to carry the steady state AC load circuit of the high efficiency lighting. A noise-insensitive semiconductor switch control circuit has an output for controlling a semiconductor switch and includes a zero voltage crossing detector which switches the output of the semiconductor switch control circuit only at the zero crossings of the AC power in response to the on/off control signal. A semiconductor switch, responsive to the output signal from the zero voltage crossing detector, is adapted to carry the AC load current and has switch leads connected in parallel across the relay switch contacts.

The delay time of the delay means is adjusted such that the sum of the delay time plus the shorter of the relay closing time or the relay opening time is greater than the time between successive zero crossings of the AC power. In this manner, the semiconductor switch is turned on at the first zero crossing of the AC power after the on/off control signal has indicated the lights should be turned on, and the mechanical relay is delayed from being turned on until after the semiconductor switch has been turned on to protect it.

In a preferred design, the control unit includes a pulse forming circuit which generates a pulse for each on-to-off and each off-to-on transition of the control signal. The control unit circuit may be separately packaged for connection to the occupancy sensor, or it may be incorporated into a complete sensor package with additional electronics and performing additional functions.

The pulses are longer in duration than the sum of the delay time plus the longer of the relay opening time or the relay closing time. The noise-insensitive circuit is responsive to the pulses from the pulse forming circuit such that the semiconductor switch is turned on before the relay changes state and remains on until after it has completed its change of state.

BRIEF DESCRIPTION OF THE INVENTIONS

For a fuller understanding of the invention, reference should be made to the following description taken in connection with the accompanying drawings, in which:

FIG. 2a is a graph of the output voltage from the pulse forming circuit at test point TP1 which controls the zero-crossing detector and the switching of the semiconductor switch.

FIG. 2b is a graph of the delayed on/off control signal voltage at the output from the electrical delay means measured at test point TP2 which controls the switching of relay K1.

Figure 1:
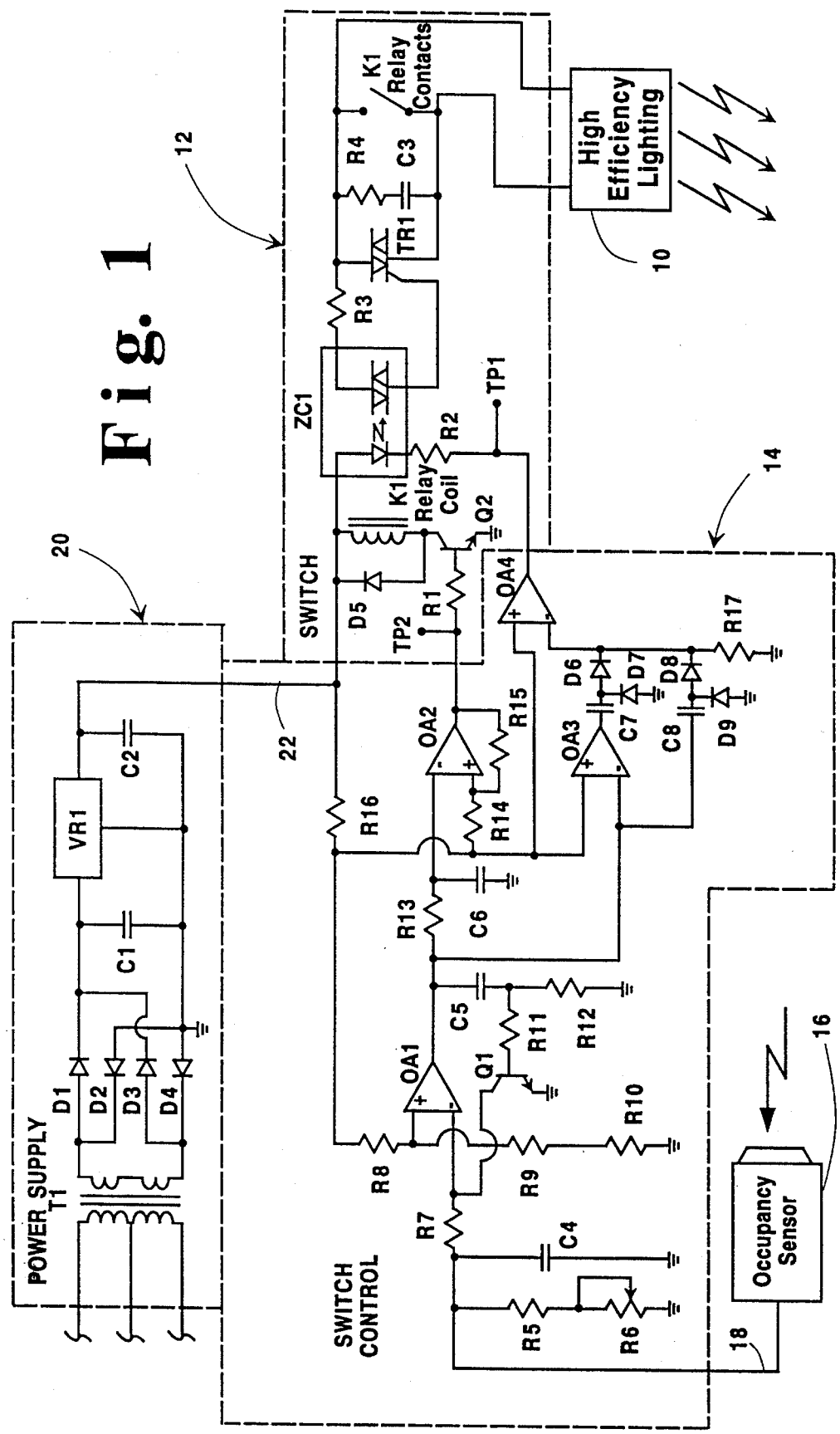
FIG. 1 is a circuit diagram showing the control unit of the present invention.

The invention accordingly comprises the features of construction, combination of elements, and arrangement of parts which will be exemplified in the construction hereinafter set forth, and the scope of the invention will be indicated in the claims.

DETAILED DESCRIPTION OF THE PREFERRED EMBODIMENT

Referring to FIG. 1, the high efficiency lighting 10 is turned on and off by the hybrid switch section 12 of the control unit circuit. The hybrid switch section 12 combines the low cost and high current carrying advantages of electromechanical relay K1 with the advantages of semiconductor switch TR1. The relay contacts of the relay K1 are protected against arcing and pitting by the semiconductor switch TR1 which acts to bypass the relay contacts whenever the relay is to be turned on or off.

Timing and control of the mechanical relay and the bypass semiconductor switch are accomplished by the switch control section 14 which receives a triggering input from occupancy sensor 16 via control lead 18. Power is provided via the power supply 20 over the power supply lead 22.

Summarizing the operation of the control unit, the occupancy sensor 16 signals the switch control 14 over control lead 18 whenever it senses that the room being monitored is occupied. The occupancy sensor signal triggers an on/off control circuit including operational amplifier OA1 and a timer circuit described below. The operational amplifiers referred to herein, including OA1-OA4 all act as voltage comparators and/or inverters. Other, types of voltage comparators/inverters including devices specifically designed for voltage comparison/inversion and digital logic gates may also be used.

The on/off control circuit provides an on/off control signal at the output of operational amplifier OA1. When the occupancy sensor 16 signals that the room is occupied, the on/off control signal calls for the lights to be turned on and the timer is set. When the timer period elapses, in the absence of any resets from the occupancy sensor, the control signal calls for the lights to be turned off.

The on/off control signal does not directly control the switching of the light, but is used as the trigger for separate circuits to control and sequence the switching of the relay K1 and the semiconductor switch TR1.

The semiconductor switch TR1 is turned on first by a noise-insensitive control circuit. In the preferred design, the noise insensitivity is achieved by the use of a zero crossing detector ZC1 which switches the semiconductor switch TR1 only at the zero voltage crossing points of the AC power for the light. In addition to more reliable switching due to the noise insensitivity, by switching at the zero-crossing points the dv/dt switching transients are minimized resulting in longer component life.

In the most highly preferred design, the semiconductor switch is turned on only for a brief time spanning the period of time when the relay K1 is changing state. This is accomplished by controlling ZC1 with a pulse forming circuit which generates a pulse of an appropriate length whenever the on/off control signal changes state. The pulse forming circuit principally includes operational amplifiers OA3 and OA4. FIG. 2a shows the pulses which are of duration $A_1$ for the off-to-on transition of the on/off control signal and duration $A_2$ for the on-to-off transition. (As explained more fully below, the "off" state of the on/off control signal is when the output of OA1 is high.)

The control circuit for the relay K1 includes an electrical delay means and operational amplifier OA2. The electrical delay is introduced to ensure that the mechanical relay K1 does not switch until after the semiconductor switch TR1 has been turned on. As described above, that will not occur until the first zero crossing of the AC power after the on/off control signal has changed state.

In this way, the high efficiency lighting load 10 is switched with a hybrid mechanical/solid state switching system. The relay contacts are protected by turning on the semiconductor switch TR1 during the switching time of the relay. Reliable switching, particularly in the off-to-on transition of the lights is achieved by the noise-insensitive characteristics of ZC1. In the absence of such noise-insensitivity, random transients and noise could retrigger the control elements when switching the noisy lighting load.

Referring again to FIG. 1, a detailed description of circuit operation will now be provided.

The circuit is powered by DC power supply 20 consisting of a standard power supply transformer T1 connected to an AC power source, a full wave bridge rectifier formed by diodes D1–D4, and voltage regulator VR1. Capacitors C1 and C2 provide input and output filtering respectively. Any suitable power supply voltage may be selected, but in the preferred embodiment, a 15 volt DC voltage is supplied to the circuit via the power supply line 22.

To simplify the circuit drawing, some AC and DC power supply wiring is not shown. Those skilled in the art will recognize that DC power is provided in a conventional manner to all of the operational amplifiers, the occupancy sensor 16 and other components that normally require such power, and AC power is provided to the high efficiency lights.

Occupancy sensor 16 may be any suitable device for sensing that the room is occupied. The preferred sensor is an infrared detector, however, other types of sensors such as ultrasonic sensors, radar sensors, capacitance proximity sensors, weight sensors or light beam sensors could be used. The only requirement is that the sensor provide either a continuous or recurring indication that the room is occupied.

The preferred infrared occupancy sensor 16 provides a signal over control lead 18 whenever motion is sensed. The occupancy sensor signal switches high whenever motion is sensed. This charges capacitor C4 which then begins to discharge through resistors R5 and R6.

Capacitor C4 and resistors R5 and R6 form a timer with an adjustable timing period set by resistor R6. The time period selected is preferably long enough that movement within the room occurs much more frequently than the time period set. This permits the occupancy sensor 16 to continuously reset the timer and keep the capacitor C4 continuously charged.

Capacitor C4 is connected to the inverting input of operational amplifier OA1 via resistor R7. The voltage at the noninverting input of operational amplifier OA1 is set by the voltage divider formed by resistors R16, R8, R9 and R10. The top of the voltage divider at R16 is connected to the DC voltage supply on line 22, and the bottom of the divider on R10 is connected to ground.

So long as the voltage on capacitor C4 is above the voltage at the noninverting input of OA1, as determined by the aforementioned voltage divider, the output of OA1 will be low. This is the "on" state of the on/off control signal and indicates that the high efficiency lighting 10 should be turned on.

When capacitor C4 discharges sufficiently through R5 and

R6, the voltage at the inverting input of OA1 will drop below the voltage at the noninverting input and the output of OA1 will return high to the "off" state of the on/off control signal.

Capacitor C5, resistors R11 and R12 and transistor Q1 form a feedback network which ensure that the on/off control signal switches cleanly and positively from the "on" state to the "off" state.

The on/off control signal at the output of OA1 is then split between a relay control circuit and a semiconductor switch control circuit at the junction between C5 and R13.

The relay control circuit includes an electrical delay means comprising resistor R13 and capacitor C6. The on/off control signal, delayed by the RC time constant of R13 and C6, is fed to the inverting input of operational amplifier OA2.

The noninverting input of OA2 is connected via R14 to the intersection of R16 and R8, which are part of the aforementioned voltage divider formed by R16, R8, R9 and R10.

Before the occupancy sensor 16 indicated that the room was occupied, the output of OA1 was high (the "off" state of the on/off control signal) and capacitor C6 was charged placing the inverting input of OA2 at a voltage above the noninverting input and holding the output of OA2 low. When the output of OA1 switches low (the "on" state), capacitor C6 begins to discharge at a rate set by resistor R13 until the voltage at the inverting input of operational amplifier OA2 has dropped below the voltage at the noninverting input set by the voltage divider R16, R8, R9 and R10.

When the voltage at the noninverting input of OA2 drops sufficiently, the output of OA2 switches high. This is shown in FIG. 2b at test point TP2 which controls the operation of relay K1. At time $t_0$, the occupancy sensor 16 has signaled that the room is occupied and OA1 has changed to the "on" state.

The on/off control signal is delayed for a duration of $B_1$ until time $t_1$ as set by the RC time constant of R13 and C6 before OA2 changes state. R13 and C6 are carefully chosen to provide the proper electrical delay time as is described more fully below.

Resistors R14 and R15 ensure that the operational amplifier OA2 switches cleanly and positively. The delayed on/off control signal at the output of OA2 operates the relay coil driver transistor Q2 through resistor R1. The coil of relay K1 operates the relay actuator which opens and closes the relay contacts of K1. Because relay K1 is mechanical, it takes the actuator a significant time to open or close the relay contacts. This time, referred to herein as the "relay opening time" and "relay closing time", respectively, varies from a few milliseconds to many, and must be considered in the timing of the control unit operation. In the preferred embodiment, a relay is used having a closing time of about 20 milliseconds and an opening time of a few milliseconds. Other relays could easily be accommodated by appropriate selection of the timing components.

The on/off control signal at the output of OA1 is also connected to the semiconductor switch control circuit, including principally OA3, OA4 and ZC1. Operational amplifiers OA3 and OA4 with diodes D6–D9, capacitors C7–C8 and resistor R17 comprise a pulse forming circuit which generates a pulse for each on-to-off and each off-to-on transition of the on/off control signal.

The output of OA1 carrying the on/off control signal is connected to the inverting input of operational amplifier OA3, which acts as an inverter, and to the input of capacitor C8. On positive going transitions of the on/off control signal ("on" state to "off" state), the capacitor/diode network formed by C8, D8 and D9, generates a positive going pulse which is fed to the inverting input of OA4. Operational amplifier OA4 shapes and inverts the pulse. On negative going transitions of the on/off control signal ("off" state to "on" state), the transition is inverted by OA3 and then passed through an identical pulse forming network, formed by capacitor C7 and diodes D6 and D7, before continuing on to the pulse shaper OA4.

Thus, regardless of whether the on/off control signal is switching from on-to-off or off-to-on, the pulse forming circuit will produce a negative going pulse at test point TP1.

This is illustrated in FIG. 2a which shows the voltage measured at TP1 at the output of OA4. At $t_0$, the occupancy sensor has indicated that the room is occupied and the output of OA1 has switched low signaling that the high efficiency lighting should be turned on. The high to low transition of the control signal is inverted by OA3, switching the output of OA4 low. This is shown by the downward transition of the voltage at time $t_0$ in FIG. 2a.

Capacitor C7 then charges through diode D6 and resistor R17 until the voltage at the inverting input of OA4 drops below the voltage at the noninverting input of OA4 at time $t_2$, whereupon the output of OA4 switches high again. The duration $A_1$ of the pulse from time $t_0$ to $t_2$ is set by the RC time constant of capacitor C7 and resistor R17.

An identical process is followed during the low to high transition of the control signal, except that the pulse flows through C8, D8 and D9 and the pulse duration $A_2$ is set by C8 and R17.

The use of a pulse forming network as described is desirable, because the pulses minimize the length of time the semiconductor switch TR1 is on to only the time spanning the period when K1 is changing state. An alternative design is to eliminate the pulse forming circuit, and turn on TR1 all the time that the relay K1 is on. This is less desirable, however, because it requires that the semiconductor switch be provided with a relatively large heat sink, should the relay contacts fail to close.

The pulses at TP1 control the zero crossing detector ZC1 via resistor R2. ZC1 is a noise insensitive semiconductor switch control, preferably a zero crossing detector, and most preferably an optically isolated zero crossing detector to isolate the low voltage control circuitry from the AC voltage of the high efficiency lighting. A preferred embodiment of the zero crossing detector ZC1 is an MOC3042 6 pin DIP optoisolator with an integral zero voltage crossing detector and a triac driver output, as manufactured by Motorola Corporation.

ZC1 should be highly noise-insensitive to switch the noisy lighting load. Conventional optoisolators are subject to inadvertent retriggering, particularly when switching the lighting load from on to off, and have insufficient noise insensitivity. Transient dv/dt immunity of one thousand volts per microsecond has been found to be sufficient for reliable operation with good noise immunity, however lower noise immunity would also be suitable, provided that it is better than that of commonly available optoisolators.

As indicated in FIG. 2a, the voltage at TP1 switches low almost immediately upon receiving the indication from the on/off control signal that the high efficiency lighting 10 should be turned on. ZC1 then waits until the next zero-crossing of the AC power signal before turning on the semiconductor switch TR1.

The electrical delay time $B_1$ is selected by adjustment of

R13 and C6 such that the sum of the electrical delay time plus the shorter of the relay closing time or the relay opening time is greater then the time between successive zero crossing of the AC power. This ensures that the zero crossing detector ZC1 will have had time to turn on the semiconductor switch TR1 before the relay closes.

Time $t_3$ indicates the end of a timer period when the on/off control signal switches to the "off" state. The pulse forming circuit immediately sends a pulse of duration $A_2$ to ZC1 which switches off TR1 at the next zero crossing. At time $t_4$, after a delay of $B_2$, the relay is told to turn on.

In a conventional 60 Hz application, the time between successive zero crossings is approximately 8.3 milliseconds. Relay opening and closing times vary from a few milliseconds to much longer.

In the preferred design, the electrical delay times $B_1$ (for the turn on of the light) and $B_2$ (for the turn off) are the same and are both nominally set to 30 milliseconds. This provides good response and guarantees that regardless of the relay closing or opening time, ZC1 will have had much longer than the maximum 8.3 milliseconds it needs to find a zero crossing and switch.

The pulse duration $A_1$ must meet the condition that it is greater than the sum of the electrical delay time plus the relay closing time. The pulse duration $A_2$ must meet the condition that it is greater than the sum of the electrical delay time plus the relay opening time. Diode D5, resistor R4 and capacitor C3 are conventional protective components for the relay.

In a practical embodiment of the present invention, a relay is selected with a closing time of about 20 milliseconds and an opening time that is only a few milliseconds. The pulse duration $A_1$ is made equal to the duration of $A_2$ (by choosing the capacitance of C7 and C8 to be the same) and is set to approximately 72 milliseconds. This is longer than the electrical delay time (30 milliseconds) plus the longer of the relay opening time or the relay closing time (20 milliseconds) and guarantees that the relay contacts will be fully closed or opened when TR1 is turned off.

In some applications, such as where very little operating power is available and pulse controlled relays are used, the timing requirements may need to be tighter, but in most applications, the long overlap times set forth above will be suitable.

Semiconductor switch TR1 may be a triac or alternistor as indicated in FIG. 1. Alternative semiconductor switches including dual SCRs, power MOSFETs or power transistors may also be used. The alternistor type of triac is perferred and provides a good balance between cost and performance.

It will thus be seen that the objects set forth above, among those made apparent from the preceding description, are efficiently attained and, since certain changes may be made in the above construction(s) without departing from the spirit and scope of the invention, it is intended that all matter contained in the above description or shown in the accompanying drawing(s) shall be interpreted as illustrative and not in a limiting sense.

While this invention has been described with reference to specific embodiments, it will be recognized by those skilled in the art that variations are possible without departing from the spirit and scope of the invention, and that it is intended to cover all changes and modifications of the invention disclosed herein for the purposes of illustration which do not constitute departure from the spirit and scope of the invention.

Having thus described the invention, what is claimed is:

1. A control unit adapted trot switching an AC powered high efficiency lighting load in response to an occupancy sensor comprising:

an on/off control circuit for controlling a relay control circuit and a noise-insensitive semiconductor switch control circuit, the on/off control circuit being adapted to receive signals from an occupancy sensor, the control circuit providing an on/off control signal having an on state indicating the load should be turned on when occupancy is sensed and an off state indicating the load should be turned off thereafter;

the relay control circuit being directly responsive to the on/off control signal and not responsive to the semiconductor switch control circuit and including a delay means for delaying the on state and the off state of the on/off control signal for a delay time;

a relay having an actuator connected to the relay control circuit which actuates relay switch contacts upon receipt of the delayed on/off control signal, the relay switch contacts being adapted to carry AC load current of the load and being movable from an open to a closed position during a relay closing time and movable from a closed to an open position during a relay opening time;

the delay time plus the shorter of the relay closing time or the relay opening time being greater than the time between successive zero crossings of the AC power;

the noise-insensitive semiconductor switch control circuit having an output for controlling a semiconductor switch and a zero voltage crossing detector that switches the output of thee semiconductor switch control circuit only at the zero crossings of the AC power responsive to the on/off control signal;

a semiconductor switch which switches in response to the noise insensitive semiconductor control circuit immediately, the semiconductor switch being adapted to carry the AC load current and having switch leads connected in parallel across the relay switch contacts; and the control unit switching the relay based on the time of the on/off control signal as delayed by the relay control circuit and not based on the time of the zero crossings of the AC power detected by the zero voltage crossing detector in the noise insensitive semiconductor control circuit.

2. A control unit according to claim 1 further comprising a pulse forming circuit responsive to the on/off control signal to generate a pulse for each on-to-off and each off-to-on transition of the control signal, and wherein the noise-insensitive semiconductor switch control circuit is responsive to the pulses from the pulse forming circuit.

3. A control unit according to claim 2 wherein the pulses have a duration which is greater than the sum of the delay time plus the longer of the relay opening time or the relay closing time.

4. A control unit according to claim 3 wherein the pulse generated at the on-to-off transition has a duration which is greater than the sum of the delay time plus the relay opening time, and the pulse generated at the off-to-on transition has a duration which is greater than the sum of the delay time plus the relay closing time.

5. A control unit according to claim 1 wherein the delay time is longer than the time between successive zero crossings of the AC power.

6. A control unit according to claim 1 wherein the on/off control circuit includes a timer to turn the control signal off a preset interval after the control signal is turned on, the control signal being turned on and the timer being reset when the occupancy sensor senses occupancy.

7. A control unit according to claim 1 wherein the occupancy sensor comprises an infrared detector.

8. A control unit according to claim 1 wherein the zero voltage crossing detector is optically isolated between an input responsive to the on/off control signal and an output providing the output signal.

9. A control unit according to claim 1 wherein the semiconductor switch comprises a triac.

10. A control unit according to claim 1 wherein the semiconductor switch comprises a pair of SCR's.

11. A control unit according to claim 1 wherein the semiconductor switch comprises an alternistor.

12. A control unit according to claim 1 wherein the occupancy sensor comprises an ultrasonic detector.

13. A control system for switching electronically ballasted AC powered high efficiency fluorescent lights comprising:

an occupancy sensor producing an occupancy signal whenever the presence of a person in a room containing electronically ballasted AC powered high efficiency fluorescent lights is sensed;

an on/off control circuit connected to the occupancy sensor and responsive to the occupancy signal, the control circuit providing an on/off control signal at an output thereof, the on/off control signal having an on state indicating the load should be turned on when occupancy is sensed and an off state indicating the load should be turned off thereafter, the on/off control circuit further including a timer to switch the on/off control signal to the off state a preset interval after the control signal is turned to the on state, the control signal being turned to the on state and the timer being reset each time the occupancy sensor senses the presence of a person in the room; and a hybrid switch specially adapt to be noise insensitive and to reliably switch electronically ballasted AC powered high efficiency fluorescent lights, the hybrid switch including:

a relay control circuit responsive to the on/off control signal and including a delay means for delaying the on state and the off state of the on/off control signal for a delay time;

a relay having an actuator connected to the relay control circuit which actuates relay switch contacts upon receipt of the delayed on/off control signal, the relay switch contacts moving between an open and a closed position and being adapted to carry AC load current of the electronically ballasted high efficiency fluorescent lighting load when in the closed position;

a noise-insensitive semiconductor switch control circuit specially adapted for controlling a semiconductor switch in a noisy electrical environment generated by the electronically ballasted AC powered high efficiency fluorescent lighting load, the semiconductor switch control circuit including a noise-insensitive zero voltage crossing detector that switches the output of the semiconductor switch control circuit at the zero crossing of the AC power responsive to the on/off control signal and means for controlling the semiconductor switch to turn the semiconductor switch on for a short duration surrounding the time when the relay is opening or closing and to turn the semiconductor switch off for long durations when the relay is remaining in the open or closed position; and the control system switching the relay based on the time of the on/off control signal as delayed by the relay control circuit and not based on the time of the zero crossings of the AC power detected by the zero voltage crossing detector in the noise insensitive semiconductor control circuit.

14. A control unit according to claim 13 wherein the means for controlling the semiconductor switch to turn the semiconductor switch on for a short duration surrounding the time when the relay is opening or closing and to turn the semiconductor switch off for long durations when the relay is remaining in the open or closed position comprises a pulse forming circuit responsive to the on/off control signal to generate a pulse for each on-to-off and each off-to-on transition of the control signal.

15. A control unit according to claim 14 wherein the pulses have a duration which is greater than the sum of the delay time of the delay means in the relay control circuit plus the longer of the relay opening time, defined as the time for the relay to move from the closed to the open position, and the relay closing time, defined as the time for the relay to move from the open to the closed position.

16. A method for saving energy by automatically turning on an electronically ballasted AC powered high efficiency fluorescent lighting load installed in a room whenever the room is occupied and automatically turning off the lighting load whenever the room is unoccupied, comprising:

sensing the presence of a person in a room containing electronically ballasted AC powered high efficiency fluorescent lights with an occupancy sensor producing an occupancy signal whenever occupancy is sensed in the room;

generating an on/off control signal in an on/off control circuit responsive to the occupancy signal from the occupancy sensor, the on/off control signal being generated in an on state indicating the load should be turned on when occupancy is sensed;

timing in a timer for a preset interval after the on/off control signal is turned to the on state and turning the on/off control signal to the off state indicating the load should be turned off;

resetting the timer to the beginning of the preset interval each time the occupancy sensor senses the presence of a person in the room switching the electronically ballasted AC powered high efficiency fluorescent lights on and off with a hybrid switch specially adapted to be noise insensitive, the lights being switched on by the hybrid switch whenever the on/off control signal is in the on state and switching the lights off whenever the on/off control signal is in the off state, the hybrid switch including:

a relay control circuit responsive to the on/off control signal and including a delay means for delaying the on state and the off state of the on/off control signal for a delay time;

a relay having an actuator connected to the relay control circuit which actuates relay switch contacts upon receipt of the delayed on/off control signal, the relay switch contacts being adapted to carry AC lead current of the electronically ballasted high efficiency fluorescent lighting lead;

a noise-insensitive semiconductor switch control circuit specially adapted for controlling a semiconductor switch in a noisy electrical environment generated by the electronically ballasted AC powered high efficiency fluorescent lighting lead, the semiconductor switch control circuit including a noise-insensitive zero voltage crossing detector that switches the output of the semiconductor switch control circuit only at the zero crossings of the AC power responsive to the on/off control signal;

a semiconductor switch which switches in response to the noise-insensitive semiconductor control circuit, the semiconductor switch being adapted to carry the AC lead current of the electronically ballasted high efficiency fluorescent lighting lead and having switch leads connected in parallel across the relay switch contacts; and the hybrid switch switching the relay based on the time of the on/off control signal as delayed by the relay control circuit and not based on the time of the zero crossings of the AC power detected by the zero voltage crossing detector in the noise insensitive semiconductor switch control circuit.

17. A method for saving energy according to claim 16 further including the steps of:

turning on the semiconductor switch only for a short duration surrounding the time when the relay is opening or closing; and turning off the semiconductor switch for long durations when the relay remains for long durations in the open or closed position.

* * * * *

UNITED STATES PATENT AND TRADEMARK OFFICE
CERTIFICATE OF CORRECTION

PATENT NO. : 5,473,202
DATED : December 5, 1995
INVENTOR(S) : Mudge et al.

It is certified that error appears in the above-identified patent and that said Letters Patent is hereby corrected as shown below:

Column 2, Line 53: "Invention" should read -- Drawings --.

Column 7, Line 66: "trot" should read -- for --.
Column 8, Line 30: "thee" should read -- the --.
Column 10, Line 58: "lead" should read -- load --.
Column 10, Line 60: "lead" should read -- load --.
Column 10, Line 65: "lead" should read -- load --.
Column 11, Lines 7-8: "lead" should read -- load --.

Signed and Sealed this

Second Day of April, 1996

Attest:

BRUCE LEHMAN

Attesting Officer

Commissioner of Patents and Trademarks